United States Patent [19]

Yoshimura

[11] 4,386,326
[45] May 31, 1983

[54] DIELECTRIC-RESONATOR-TUNED MICROWAVE SOLID STATE OSCILLATOR

[75] Inventor: Yoshikazu Yoshimura, Takatsuki, Japan

[73] Assignee: Matsushita Electric Industrial Co., Ltd., Kadoma, Japan

[21] Appl. No.: 294,012

[22] Filed: Aug. 18, 1981

Related U.S. Application Data

[63] Continuation of Ser. No. 64,530, Aug. 7, 1979, abandoned.

[51] Int. Cl.³ .............................................. H03B 9/12
[52] U.S. Cl. ................................. 331/96; 331/107 DP
[58] Field of Search ................... 331/96, 101, 107 DP, 331/107 SL, 107 G; 333/219, 227, 230, 231

[56] References Cited

U.S. PATENT DOCUMENTS 3,278,868  10/1966  Kach ..................................... 333/231
3,626,327  12/1971  Luchsinger et al. ......... 331/107 DP
4,008,446   2/1977  Hirai ..................................... 331/96

FOREIGN PATENT DOCUMENTS 2805254  8/1979  Fed. Rep. of Germany .

OTHER PUBLICATIONS

Patent Abstracts of Japan; vol. 1; No. 138; Nov. 12, 1977; p. 6645E77; JP-A-52 75 156, (Matsushita Denki Sangyo K.K.), Jun. 23, 1977.
Patent Abstracts of Japan; vol. 1; No. 94; Aug. 27, 1977; p. 2649E77; JP-A-52 29 147, (Matsubishi Denki K.K.), Mar. 4, 1977.
Patent Abstracts of Japan; vol. 1; No. 155; Dec. 12, 1977; p. 8312E77; JP-A-52 97 658, (Tokyo Shibaura Denki K.K.), Aug. 16, 1977.
Patent Abstracts of Japan; vol. 1; No. 139; Nov. 15, 1977; p. 6742E77; JP-A-52 75 957, (Matsushita Denki Sangyo K.K.), Jun. 25, 1977.
Makino et al.; "A Highly Stabilized MIC Gunn Oscillator Using a Dielectric Resonator"; IEEE Transactions or Microwave Theory and Techniques; vol. MTT-27, No. 7, Jul. 1979, pp. 633-638.
Van Bladel; "Dielectric Resonator in a Waveguide Above Cut-Off"; Archiv fur Elektronic und Ubertragungstechmik, Band 32, Heft 12, Dec. 1978; pp. 465-472.

Primary Examiner—Siegfried H. Grimm
Assistant Examiner—Edward P. Westin
Attorney, Agent, or Firm—Cushman, Darby & Cushman

[57] ABSTRACT

A microwave solid state oscillator of a compact size for generating an oscillation of a highly stabilized frequency, comprising a cavity resonator having a coupling window for coupling with an external circuit, a solid state oscillation device and a dielectric resonator of a large dielectric constant and a high Q factor, characterized in that the solid state oscillation device is installed in a recess which is formed on an inner side wall of the cavity resonator and having an opening sufficiently small compared with an internal size of the cavity resonator, and the dielectric resonator is disposed in the cavity resonator in a manner to face to and to be adjacent to the opening of the recess.

23 Claims, 16 Drawing Figures

FIG. 1 (a)

Prior Art

FIG. 1 (b)

Prior Art

DIELECTRIC-RESONATOR-TUNED MICROWAVE SOLID STATE OSCILLATOR

This is a continuation of application Ser. No. 64,530 filed Aug. 7, 1979, now abandoned.

BACKGROUND OF THE INVENTION

1. Field of the Invention:

This invention relates to a solid state oscillator for use in a microwave circuit.

2. Prior Art:

One of the most troublesome problems in a microwave or a millimeter wave apparatus using a solid state oscillation device such as a Gunn diode and an IMPATT diode is how to stabilize an oscillation frequency of a microwave solid state oscillator by a simple means. There has been a known measure that a solid state oscillation device and a dielectric resonator of a large dielectric constant, a large quality factor (hereinafter referred to as Q factor) and high stability are electromagnetically coupled with each other (high stability means here that a resonance frequency of the dielectric resonator has a small temperature coefficient).

In such a conventional configuration, the dielectric resonator is disposed at a cut-off region of a first rectangular waveguide, and a second rectangular waveguide or a coaxial cable is disposed adjacent to the cut-off region. Further, a solid state oscillation device is mounted in either one of two ways: It is mounted at a place where the oscillation device is electromagnetically coupled with the dielectric resonator inside either the second rectangular waveguide or the coaxial transmission line. Alternatively, it is mounted at a place where the oscillation device is electromagnetically coupled with the dielectric resonator inside the cut-off region of the first rectangular waveguide.

An oscillation power of a stabilized oscillation frequency is taken out by an external circuit connected to the cut-off region.

In both cases the dielectric resonator is disposed in the cut-off region of the rectangular waveguide. The reason why the dielectric resonator is disposed in the cut-off region of the rectangular waveguide is as follows. Only an evanescent electromagnetic field (electromagnetic field decaying exponentially with respect to the distance) exists inside the cut-off region. The dielectric resonator only is a resonance circuit component capable of coupling with the external circuit. The dielectric resonator has a characteristic of a band-pass filter when it is disposed at a place where the evanescent electromagnetic field is not entirely decayed. By disposing the dielectric resonator between the solid state oscillation device and the external circuit, an electromagnetic power of an oscillation frequency almost solely controlled by the dielectric resonator can be taken out from the external circuit.

Figure 1:
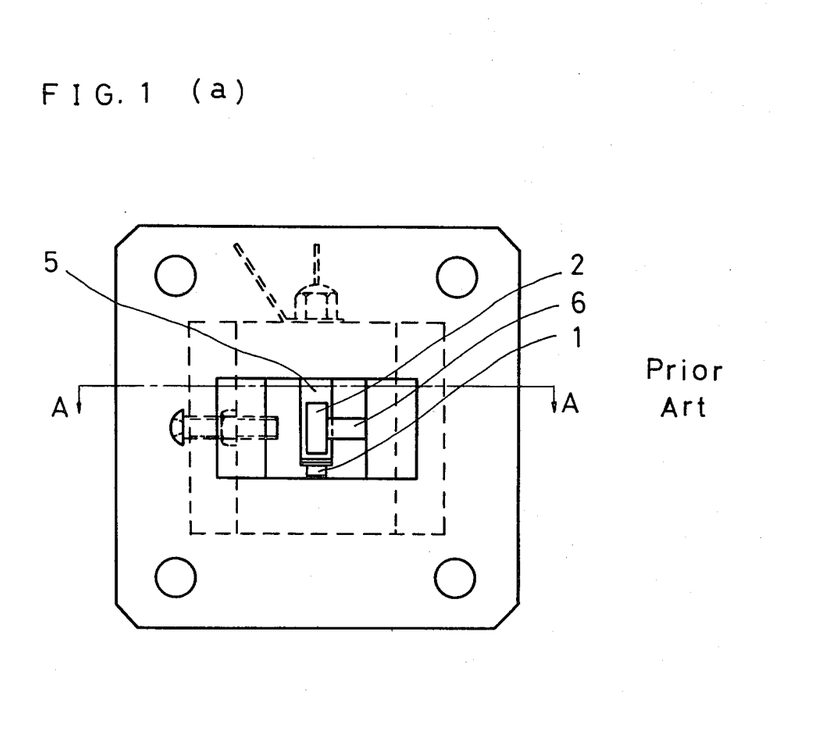
FIG. 1(a) is a front view of a conventional microwave solid state oscillator using a dielectric resonator and FIG. 1(b) is a cross sectional view taken on the plane shown by the A—A line of FIG. 1(a).

One example of the conventional configurations of a microwave solid state oscillator is shown in FIG. 1(a) and FIG. 1(b). FIG. 1(a) is a front view of a microwave solid state oscillator and FIG. 1(b) is a cross sectional view taken on the plane shown by the line A—A in FIG. 1(a). A conductor 5 of a column in shape is disposed at a place inside a cut-off region 4 of a rectangular waveguide and perpendicular to the H-planes of the rectangular waveguide. A solid state oscillation device 1 is disposed at a space between the column-shaped conductor 5 and the H-plane. A disc-shaped dielectric resonator 2 of a large dielectric constant and a large Q factor is positioned by a supporter 6 in such a manner that the disc plate face thereof is parallel to the E-plane. With such a configuration the solid state oscillation device 1 and the dielectric resonator 2 are electromagnetically coupled with each other and an oscillation power of a stabilized oscillation frequency is taken out from an output port 3, to which a rectangular waveguide is attached. The dielectric resonator 2 should lead to a highly stability of the oscillation frequency of the microwave solid state oscillator even for the variation of the oscillation frequency of the solid state oscillation device per se.

In such a conventional configuration, the dielectric resonator is disposed inside the cavity defined by the cut-off region, and therefore it is necessary that the dielectric resonator 2 is disposed apart from the output port 3 and the solid state oscillation device 1 by certain distances, and further the solid state oscillation device 1 must be kept apart from the terminated short-circuited plane. For instance, in case a cut-off region is formed to have a width of ½ of the longer side of the rectangular opening of the rectangular waveguide, a distance of about λg/2 is necessary between the solid state oscillation device 1 and the terminated short-circuited plane, where λg is a guide wavelength of the rectangular waveguide. Such spacing makes the size of the whole oscillator as large as about λg. On the other hand, there is a limit to shorten the longer side of the rectangular opening in order to shorten the size of the apparatus, since an effective unloaded Q factor decreases due to the wall proximity effect of the dielectric resonator by the conductive wall when the longer side is shortened by less than one half of the original length and a cut-off region is formed.

On the other hand, when a coaxial transmission line configuration is employed for a mounting portion of the solid state oscillation device in order to shorten the distance between the solid state oscillation device 1 and the terminated short-circuited plane, then the size of the mounting portion becomes large in the axial direction of the coaxial transmission line due to a mounting configuration. It is also difficult to accurately install the dielectric resonator and the supporter thereof inside the narrow and deep cut-off region.

SUMMARY OF THE INVENTION

The present invention purports to provide a microwave solid state oscillator wherein an oscillation frequency is stabilized by coupling electromagnetically a solid state oscillator device with a dielectric resonator of a large dielectric constant and a high Q factor.

DESCRIPTION OF THE PREFERRED EMBODIMENTS

A microwave solid state oscillator of the present invention comprises a cavity resonator having a coupling window for coupling with an external circuit, a solid state oscillation device and a dielectric resonator of a large dielectric constant and a high Q factor and is characterized in that the solid state oscillation device is installed in a recess formed on the inner wall of the cavity resonator and having an opening sufficiently smaller than the internal size of the cavity resonator and that the dielectric resonator is disposed in the cavity resonator in a manner to face to and adjacent to the opening of the recess.

The microwave solid state oscillator in accordance with the present invention can generate a microwave power, the frequency of which is highly stabilized by using a cavity resonator of a simple structure without forming a cut-off region. In other words, the disclosed oscillator has a non-cut-off characteristic in the operating frequency region. Therefore, manufacture of the oscillator becomes simple, and besides it is possible to construct the oscillator in a small size thus making it light in weight.

Figure 2:
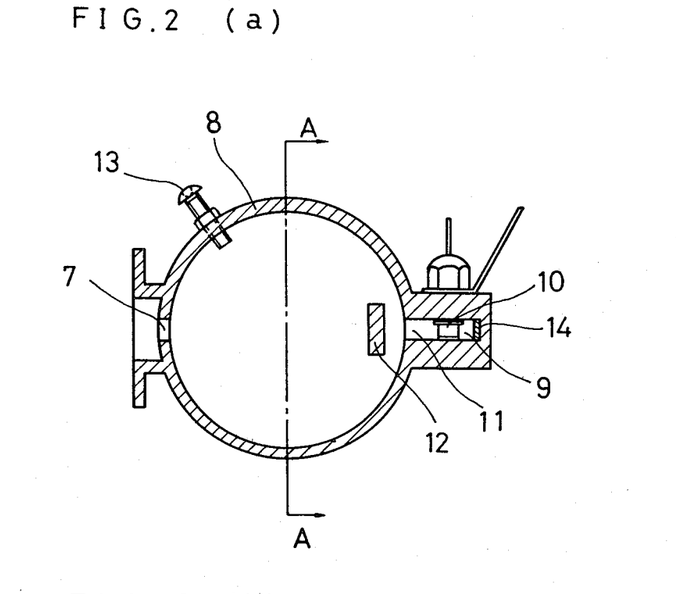
FIG. 2(a) is a sectional side elevation view of a microwave solid state oscillator in accordance with a first embodiment of the present invention.
FIG. 2(b) is a cross sectional view taken on the plane shown by the A—A line of FIG. 2(a).

The present invention is hereinafter elucidated in detail by referring to the drawings. FIG. 2(a) is a sectional side elevation view of a microwave solid state oscillator in accordance with a first embodiment of the present invention, and FIG. 2(b) is a cross sectional view taken on the plane shown by the A—A line of FIG. 2(a). A recess 9 having an opening 11 sufficiently smaller than the internal size of a cavity resonator 8 is formed at a specified predetermined place on the inner wall of the cavity resonator 8. The cavity resonator 8 comprises a coupling window 7 for coupling with an external circuit. The recess 9 is a narrow space surrounded by conductive walls except at the opening 11, and a solid state oscillation device 10 is disposed therein. A dielectric resonator 12 of a disc plate in shape, a large dielectric constant and a high Q factor is disposed adjacent to and facing to the opening 11 of the recess 9, so as to electromagnetically couple the dielectric resonator 12 with the solid state oscillation device 10. An oscillation power of a stabilized oscillation frequency determined by a resonance frequency of the dielectric resonator 12 is taken out through the coupling window 7 into the external circuit. Although the shape of the cavity resonator 8 is spherical in FIGS. 2(a) and 2(b) for simplicity, other shapes can be employed for the cavity resonator 8 in this embodiment. It is also possible to form the opening 11 in a shape other than the slot shown in FIGS. 2(a) and 2(b), as far as the size thereof is sufficiently small compared with the internal diameter of the cavity resonator 8 and the dielectric resonator 12 is electromagnetically coupled with the solid state oscillation device 10 through the opening 11. The cavity resonator 8 may further comprise an oscillation frequency adjustment means 13 and/or an electromagnetic wave absorber 14 of ferrite. The oscillation frequency adjustment means 13 is used for a fine frequency adjustment. The electromagnetic wave absorber 14 is disposed at least at one place on inner walls of the coupling window 7, the cavity resonator 8 and the recess 9. The electromagnetic wave absorber 14 prevents an undesirable jump phenomenon of oscillation frequencies peculiar to the solid state oscillation device 10 and it also prevents an undesirable phenomenon that the oscillation is likely not to be excited when a power source is connected to the solid state oscillation device 10.

The features of constructions of the present oscillator have the following characteristics. The recess 9 formed on the inner wall of the cavity resonator 8 serves to concentrate an electromagnetic energy from the solid state oscillation device 10 in the narrow space surrounded by the conductive side walls thereby to assure a reliable oscillation. The dielectric resonator 12 of a large dielectric constant and a large Q factor also concentrates the electromagnetic energy in a narrow space. Therefore, it is easy to electromagnetically couple the dielectric resonator 12 with the solid state oscillation device 10 by disposing the disc plate face of the dielectric resonator 12 so as to be adjacent to and to face to the opening 11 of the recess 9. The explanation of why the dielectric resonator 12 is disposed in such a manner that the disc plate face thereof faces to the opening 11 of the recess 9 is as follows.

An external high frequency magnetic force lines (high frequency is hereinafter designated as a frequency in a microwave and a millimeter wave ranges) inducing the dominant mode $H_{01\delta}$ ($\delta$ is a parameter depending on the thickness of the disc-shaped dielectric resonator 12) of the disc-shaped dielectric resonator 12 are almost perpendicular to the disc plate face except the peripheral part thereof. On the other hand, a magnetic wall is formed at the opening 11 of the recess 9 (the magnetic wall is defined as a wall on which $\vec{n}\cdot\vec{E}=0$ and $\vec{n}\times\vec{H}=0$ are satisfied, wherein $\vec{E}$ is a high frequency electric field vector, $\vec{H}$ a high frequency magnetic field vector and $\vec{n}$ a unit normal vector of the wall, respectively).

Therefore, the high frequency magnetic field induced by the solid state oscillation device 10 forms lines of magnetic force almost perpendicular to the opening face of the recess 9, the direction of the lines of magnetic force being same as that of a high frequency magnetic field to induce the dominant mode $H_{01\delta}$ in the dielectric resonator 12. Accordingly, the dominant mode $H_{01\delta}$ is induced in the dielectric resonator 12 thus coupling the dielectric resonator 12 electromagnetically with the solid state oscillation device 10.

The size of the cavity resonator 8 can be selected in such a manner that it has a resonance frequency in the utilizing frequency range. But it is preferable to make the size as small as possible (minimum limit is around a quarter of the wavelength corresponding to the utilizing frequency range) so as to have a resonance frequency higher than the one in that frequency range, since such size reduction of the cavity resonator 8 renders the oscillator body in a compact form. The size reduction of the cavity resonator 8 is possible without trouble since the wall proximity effect of the dielectric resonator 12 is reduced by employing the configuration that the disc plate face of the dielectric resonator 12 faces to the opening 11 of the recess 9.

There is only one recess 9, one solid state oscillation device 10, one dielectric resonator 12 and one coupling window 7 for coupling with the external circuit, in FIGS. 2(a) and 2(b). However, in order to increase the output power, it is also possible to employ other configurations that plural solid state oscillation devices are installed in one recess, or alternatively that one or plural solid state oscillation devices are installed respectively at plural recesses. In order to improve the stability of the oscillation frequency, it is possible to dispose plural disc-shaped dielectric resonators so as to be adjacent to and to face to one respective recess.

In the description of the present invention, the term "the dielectric resonator of high stability" does not necessarily imply that a temperature coefficient of the resonance frequency of the dielectric resonator is nearly equal to zero. But it implies that a temperature coefficient of the oscillation frequency of the whole microwave solid state oscillator including the dielectric resonator is nearly equal to zero. In other words, this means that the temperature coefficient of the resonance frequency of the dielectric resonator has a small positive value. In addition, the term "stability" also implies a good reproducibility of the resonance frequency and a high stability of the resonance frequency with respect to a lapse of time.

A microwave solid state oscillator of a second embodiment in accordance with the present invention is shown in FIGS. 3(a), 3(b) and 3(c). FIG. 3(a) is a front view of the microwave solid state oscillator, FIG. 3(b) a cross sectional view taken on the plane shown by the A—A line of FIG. 3(a), and FIG. 3(c) a cross sectional view taken on the plane shown by the B—B line of FIG. 3(a), respectively.

Figure 3:
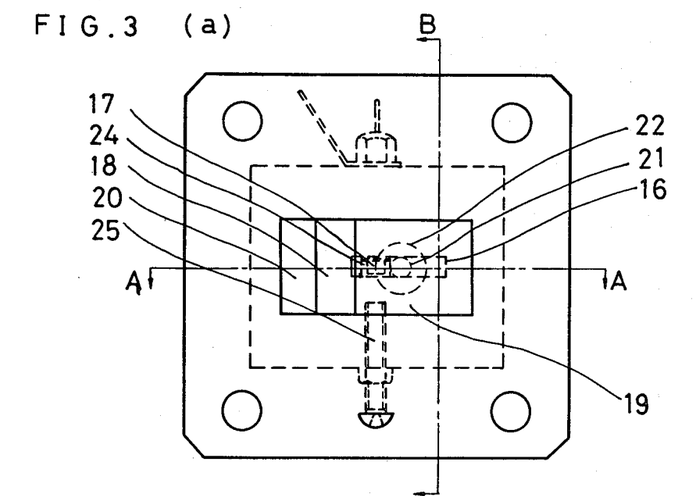
FIG. 3(a) is a front view of a microwave solid state oscillator in accordance with a second embodiment of the present invention.
FIG. 3(b) is a cross sectional view taken on the plane shown by the A—A line of FIG. 3(a)
FIG. 3(c) is a cross sectional view taken on the plane shown by the B—B line of FIG. 3(a).

FIGS. 4(a) and 4(b) are respectively a front view and a sectional side elevation view of the microwave solid state oscillator shown in FIG. 3 indicating dimensions of principal portions thereof. One side wall in the axial direction of a cavity resonator 15 of a rectangular waveguide is short-circuited by a conductive wall 151. At a middle part of the conductive wall 151 is formed a recess 16 having a slot-shaped opening of an area of $a' \times b'$ (where $a'$, $b'$ are the lengths of the longer side and the shorter side, respectively) and having a depth of $c'$. The recess 16 is formed in a manner that the longer side of the slot-shaped opening is parallel to the H-plane of the rectangular waveguide. A solid state oscillation device 17 is disposed at a position inside the recess 16 in a manner that the axis of the solid state oscillation device 17 is parallel to the shorter side of the slot-shaped opening.

The size $a'$ of the longer side of the slot-shaped opening is equal or nearly equal to $\frac{1}{2}$ of a width $a$ of the rectangular waveguide. The size $b'$ is equal or nearly equal to a height of a package of the solid state oscillation device 17. Accordingly, the area ($a' \times b'$) of the slot-shaped opening is sufficiently small compared with an area ($a \times b$) of the terminated short-circuited plane 151, which is one inner wall plane of the cavity resonator 15 of the rectangular waveguide. For instance, in case of a rectangular waveguide specified by WRJ-120 under the standards of the Electronic Industries Association of Japan (E. I. A. J.), the sizes are $a = 19.05$ mm and $b = 9.525$ mm. However, in this embodiment the sizes are $a' = 9.0$ mm and $b' = 3.0$ mm, and therefore the ratio is $(a' \times b')/(a \times b) \simeq 1/7$. The depth $c'$ of the recess 16 is selected to have such a value that the solid state oscillation device 17 is installed with an ample space to a certain extent. The value $c'$ should substantially satisfy an inequality relation, $\lambda g/8 < c' < \lambda g/4$. It is therefore possible to dispose the solid state oscillation device 17 in the narrow recess 16 by employing the abovementioned configuration. This is not possible in the conventional case of FIG. 1.

As will be described below, it is possible to experimentally determine the length $a'$ of the longer side of the slot-shaped opening and a distance d defining the position of the solid state oscillation device 17 inside the recess 16. In FIGS. 3(a)–3(b) and FIGS. 4(a)–4(b), it is shown that the solid state oscillation device 17 is situated at the center of the cavity resonator 15 when seen from a cross section perpendicular to the axial direction of the rectangular waveguide. This position is however not substantially important, though it is necessary to change the sizes of the several portions when the position of the solid state oscillation device 17 is slightly changed.

On the other hand, conductive plates 19 and 20 are provided on the other side of the cavity resonator 15 of the rectangular waveguide, namely, at the side opposite to the short-circuited plane 151 in the axial direction of the rectangular waveguide. An inductive window 18 is formed between the conductive plates 19 and 20. A supporter means 21 for supporting a dielectric resonator 22 is fixed at one end thereof on the conductive plate 19 by adhesives (the supporter means 21 is not shown in FIG. 4(b)). The supporter means 21 should have a small dielectric constant and small dielectric loss in the high frequency range. Further, it should have a small coefficient of thermal expansion. A preferable material of the supporter means 21 is quartz glass. The dielectric resonator 22 is fixed at the opposite tip of the supporter means 21 by adhesives. A rectangular waveguide 23 is further provided on the output side of the inductive window 18 for a connection of an external circuit.

The length of the cavity resonator 15 of the rectangular waveguide in the axial direction is selected to be about $\lambda g/4$ taking account of both the reduction of the size of the microwave solid state oscillator and the wall proximity effect of the dielectric resonator 22. But the length of $\lambda g/4$ can be shortened further, since the length of $\lambda g/4$ has some play for the wall proximity effect. It is naturally possible to lengthen the length of the cavity resonator 15 when the smallness of the microwave solid state oscillator is not important. The total size of the microwave solid state oscillator in accordance with the second embodiment amounts to about $\lambda g/2$ or a bit smaller value than that. Furthermore, it is also possible to form a recess on a side wall of the E- plane in place of on the terminated short-circuited plane 151 of the cavity resonator 15. This would enable further reduction of the total size of the microwave oscillator.

The area of the inductive window 18 affects the magnitude of the electromagnetic coupling of the external circuit 23 with the dielectric resonator 22. A conductive screw 25 for a fine frequency adjustment is disposed adjacent to the inductive window 18 and projecting on and through the H-plane. By changing the insertion position of the conductive screw 25, it is also possible to vary the magnitude of the electromagnetic coupling of the dielectric resonator 22 with the solid state oscillation device 17 and further the magnitude of the electromagnetic coupling of the external circuit 23 with the dielectric resonator 22, in addition to the fine adjustment of the oscillation frequency by using it.

In the second embodiment, the length of the cavity resonator 15 of the rectangular waveguide in the axial direction is about $\lambda_g/4$, and hence the cavity resonator 15 has no resonance frequency in the oscillation frequency range of this microwave solid state oscillator. Therefore, the solid state oscillation device 17 does excite only the dielectric resonator 22, and the part of the resonance circuit other than the dielectric resonator 22 is not excited. Therefore, a highly stable oscillation is obtainable. In order to improve the oscillation stability, an electromagnetic wave absorber 24 is further provided on the inner wall of the recess 16. The electromagnetic wave absorber 24 prevents an undesirable jump phenomenon of the oscillation frequency peculiar to the solid state oscillation device 17 and it also prevents an undesirable phenomenon that the oscillation is not likely to be excited when a power source is connected to the solid state oscillation device 17.

A magnetic wall is also formed at the slot-shaped opening in a similar manner to the case of the first embodiment. A dominant H mode is induced in the disc-shaped dielectric resonator 22 which is adjacent to and faces to the slot-shaped opening. Therefore, the dielectric resonator 22 is electromagnetically coupled with the solid state oscillation device 17.

Figures 5, 6:
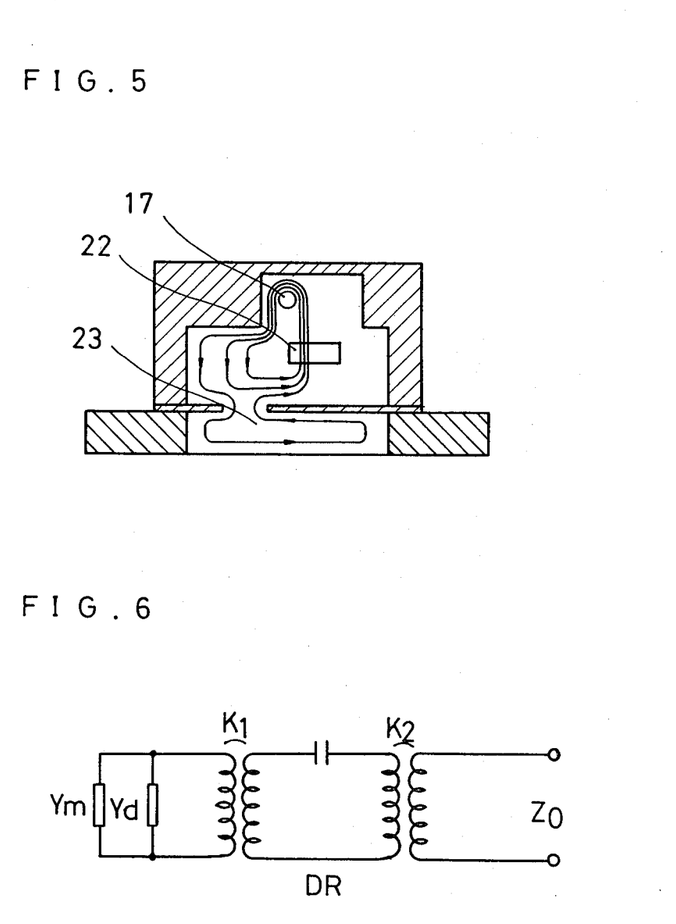
FIG. 5 is an explanatory view of magnetic force lines schematically showing an electromagnetic coupling between three circuit elements of FIG. 3, the solid state oscillation device, the dielectric resonator and the external circuit.
FIG. 6 is a view showing an equivalent circuit of the microwave solid state oscillator of FIG. 5.

FIG. 5 shows a state of mutual electromagnetic coupling by the microwave magnetic force lines among the solid state oscillation device 17, the dielectric resonator 22 and the external circuit 23.

Figure 4:
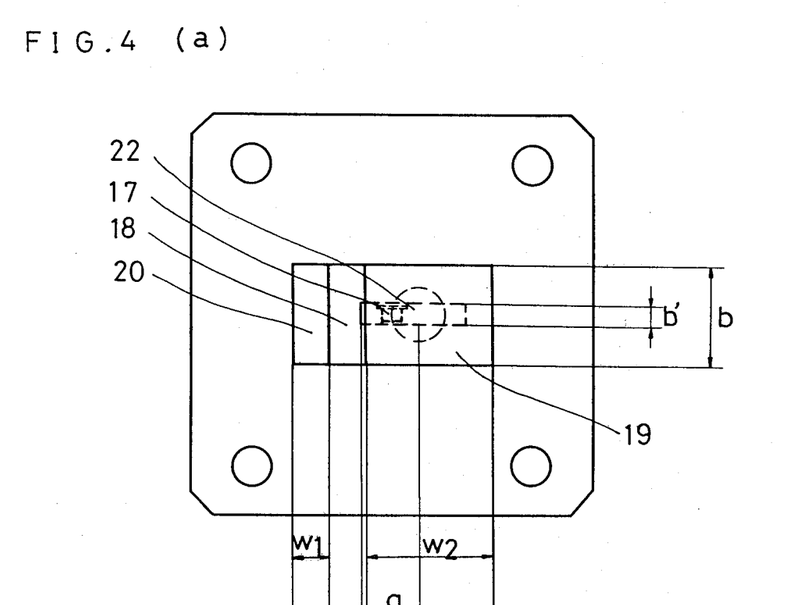
FIGS. 4(a) and 4(b) are a front view and a sectional side elevation view of the microwave solid stage oscillator shown in FIG. 3, indicating dimensions of principal portions thereof, respectively.

From the elucidation so far described, an electric equivalent circuit of the microwave oscillator in accordance with the second embodiment of the present invention can be visualized as shown in FIG. 6. In the equivalent circuit, $Y_d$ designates an admittance of the solid state oscillation device 17 when operating and has a negative conductance component. $Y_m$ designates a susceptance determined by the geometrical dimensions of the recess 16, where the solid state oscillation device 17 is mounted. DR designates a series resonant circuit of a high Q factor corresponding to the dielectric resonator 22. The mutual coupling between the solid state oscillation device 17 and the dielectric resonator 22 is expressed by a coupling coefficient K1 and the mutual coupling between the dielectric resonator 22 and the external circuit 23 is expressed by a coupling coefficient K2. $Z_0$ shows a load impedance of the external circuit 23. As illustrated in FIG. 4, in case the solid state oscillation device 17 and the dielectric resonator 22 are determined, the size a' of the longer side of the slot-shaped opening, the distance d of the solid state oscillation device 17 from the inner surface of the recess 16, the distances (x, y₁) of the dielectric resonator 22 from the solid state oscillation device 17, the distance y₂ between the dielectric resonator 22 and the conductive plate 19, and the sizes W₁ and W₂ can be obtained by repeated experiments made in a manner to obtain target stability factors of the oscillation frequency against temperature $\Delta f_T$, that against load $\Delta f_L$, and an oscillation power $P_0$ as the desirable value. Qualitatively speaking, this with reference to FIG. 6, the stability factor against temperature $\Delta f_T$ of the oscillation frequency is mainly dependent on each temperature characteristic of the solid state oscillation device 17 and the dielectric resonator 22, and the coupling coefficient K1 between both the device 17 and the resonator 22. The stability factor against the load $\Delta f_L$ of the oscillator is mainly dependent on the coupling coefficient K2 between the dielectric resonator 22 and the external circuit 23.

On the other hand, the oscillation power depends on both of these coupling coefficients K1 and K2. The stability factor against temperature $\Delta f_T$ can be measured by an amount of the frequency shift when temperature is changed, for instance, from $-20°$ C. to $+40°$ C. And the stability factor against load $\Delta f_L$ can be measured by the amount of the frequency shift when the phase of the external load is changed from 0° to 360° by keeping the VSWR against the external load at a constant value, for example at 1.5. In order to obtain the best stability factor against temperature $\Delta f_T$ with using a desired solid state oscillation device, we must carry out the foregoing experiments by replacing dielectric resonators having various temperature coefficients one by one. An actually measured example of the present embodiment is as follows:

| | |
|---|---|
| Rectangular waveguide | WRJ-120 |
| Solid state oscillation device | Gunn diode |
| Operation voltage | 7.5 V |
| Current | 150 mA |
| Rated frequency | 12.0 GHz |
| Output power | 43 mW |
| Dielectric resonator: | Resomics (registered trade mark of Murata Mfg. Co., Ltd., Japan) |
| Diameter of disc | 5 mm |
| Specific dielectric constant | 37.6 |
| Unloaded Q | 4,000 |
| Temperature dependence of the resonance frequency | $\partial f/\partial T = +4.1$ ppm/°C. |
| Data of the output frequency of the microwave solid state oscillator | |
| Output frequency $f_O$ | 11.660 GHz |
| Output power $P_O$ | 10 mW |
| Stability factor against temperature $\Delta f_T$ | 340 KHz |
| Stability factor against load $\Delta f_L$ | 280 KHz |

As to a coupling means with the external circuit, the rectangular waveguide is used as an output transmission line in the second embodiment. However, both coaxial transmission line and microwave stripline can also be used. Embodiments using them are described below.

Figure 7:
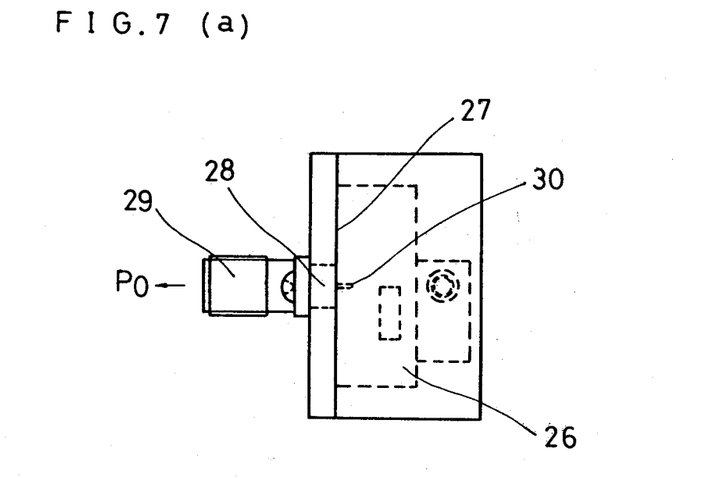
FIG. 7(a) is a plan view of a microwave solid state oscillator in accordance with a third embodiment of the present invention.
FIG. 7(b) is a transverse side view of the same in FIG. 7(a).

A microwave solid state oscillator of a third embodiment in accordance with the present invention is shown in FIGS. 7(a) and 7(b). FIG. 7(a) is a plan view of the microwave solid state oscillator and FIG. 7(b) is a transverse side view of the same in FIG. 7(a). A coaxial cable is employed as an output transmission line in this embodiment. A frequency adjustment means, an electromagnetic wave absorber, a supporter means of a dielectric resonator and a voltage supply terminal of a solid state oscillation device are not shown in FIG. 7(a) and tromagnetic wave absorber is disposed at least at an inner wall of said recess.

3. A dielectric-resonator-tuned microwave solid state oscillator in accordance with claim 1 or 2, wherein said cavity resonator is a sphere in shape, said coupling window is provided in the wall opposite to said coupling window.

4. A dielectric-resonator-tuned microwave solid state oscillator in accordance with claim 1 or 2
wherein said cavity resonator is a rectangular resonator, a rectangular waveguide being connected thereto through a conductive plate having an inductive window as said coupling window, and said recess is formed on the side wall of said rectangular resonator opposite to said conductive plate.

5. A dielectric-resonator-tuned microwave solid state oscillator in accordance with claim 1 or 2
wherein said cavity resonator is a rectangular resonator, a coaxial cable as said external circuit being coupled therewith by extending a looped central conductor of said coaxial cable into said rectangular resonator, and said recess is formed on one side wall of said rectangular resonator opposite to said looped central conductor.

6. A dielectric-resonator-tuned microwave solid state oscillator in accordance with claim 1 or 2
wherein said cavity resonator is a rectangular resonator, a stripline being attached thereto as said external circuit, and said recess is formed on one side wall of said rectangular resonator.

7. A dielectric-resonator-tuned microwave solid state oscillator in accordance with claim 6 wherein a depth of said recess is larger than $\lambda g/8$ and smaller than $\lambda g/4$, where $\lambda g$ is a guide wavelength.

8. A dielectric-resonator-tuned microwave solid state oscillator in accordance with claim 1 or 2 wherein a depth of said recess is larger than $\lambda g/8$ and smaller than $\lambda g/4$, where $\lambda g$ is a guide wavelength.

9. A dielectric-resonator-tuned microwave solid state oscillator in accordance with claim 3 wherein a depth of said recess is larger than $\lambda g/8$ and smaller than $\lambda g/4$ (where $\lambda g$ is a guide wavelength).

10. A dielectric-resonator-tuned microwave solid state oscillator in accordance with claim 4 wherein a dpeth of said recess is larger than $\lambda g/8$ and smaller than $\lambda g/4$, where $\lambda g$ is a guide wavelength.

11. A dielectric-resonator-tuned microwave solid state oscillator in accordance with claim 5 wherein a depth of said recess is larger than $\lambda g/8$ and smaller than $\lambda g/4$, where $\lambda g$ is a guide wavelength.

12. A dielectric-resonator-tuned microwave solid state oscillator comprising:
a cavity resonator having a coupling window for coupling with an external circuit, and having a recess on an inner side wall of said cavity resonator with an opening sufficiently smaller than an internal size of said cavity resonator,
a solid state oscillation device oscillating at a frequency, and
a dielectric resonator of a large dielectric constant and a high Q factor,
wherein said cavity resonator is a waveguide having a geometrical dimension which affords a non-cut-off characteristic for said frequency,
said solid state oscillation device is installed deep inside said recess, and said dielectric resonator is disposed in a non-cut-off-region in said cavity resonator in a manner to face and be adjacent to said opening of said recess.

13. A dielectric-resonator-tuned microwave solid state oscillator in accordance with claim 12 wherein a depth of said recess is larger than $\lambda g/8$ and smaller than $\lambda g/4$, where $\lambda g$ is a guide wavelength.

14. A dielectric-resonator-tuned microwave solid state oscillator in accordance with claim 12
wherein said cavity resonator is a rectangular resonator, a stripline being attached thereto as said external circuit, and said recess is formed on one side wall of said rectangular resonator.

15. A dielectric-resonator-tuned microwave solid state oscillator in accordance with claim 12 wherein said cavity resonator is a sphere in shape, said coupling window is provided in the wall and said recess is formed in said wall opposite to said coupling window.

16. A dielectric-resonator-tuned microwave solid state oscillator in accordance with claim 12
wherein said cavity resonator is a rectangular resonator, a rectangular waveguide being connected thereto through a conductive plate having an inductive window as said coupling window, and said recess is formed on the side wall of said rectangular resonator opposite to said conductive plate.

17. A dielectric-resonator-tuned microwave solid state oscillator in accordance with claim 12
wherein said cavity resonator is a rectangular resonator, a coaxial cable as said external circuit being coupled therewith by extending a looped central conductor of said coaxial cable into said rectangular resonator, and said recess is formed on one side wall of said rectangular resonator opposite to said looped central conductor.

18. A dielectric-resonator-tuned microwave solid state oscillator comprising
a cavity resonator having a coupling window for coupling with an external circuit, and having a recess on an inner side wall of said cavity resonator with an opening sufficiently smaller than an internal size of said cavity resonator,
a solid state oscillation device disposed in said recess and oscillating at a frequency, and
a dielectric resonator of a large dielectric constant and a high Q factor,
wherein said cavity resonator is a waveguide having a geometrical dimension which affords a non-cut-off characteristic for said frequency, and
said dielectric resonator is disposed in a non-cut-off region in said cavity resonator in a manner to face to and be adjacent to said opening of said recess.

19. A dielectric-resonator-tuned microwave solid state oscillator in accordance with claim 18 wherein said cavity resonator is a sphere in shape, said coupling window is provided in the wall and said recess is formed in said wall opposite to said coupling window.

20. A dielectric-resonator-tuned microwave solid state oscillator in accordance with claim 18
wherein said cavity resonator is a rectangular resonator, a rectangular waveguide being connected thereto through a conductive plate having an inductive window as said coupling window, and said recess is formed on the side wall of said rectangular resonator opposite to said conductive plate.

21. A dielectric-resonator-tuned microwave solid state oscillator in accordance with claim 18
wherein said cavity resonator is a rectangular resonator, a coaxial cable as said external circuit being FIG. 7(b). The configuration of the microwave solid state oscillator is the same as that of the second embodiment except a coupling portion for coupling with an external circuit. Therefore, an elucidation is given here only for the coupling portion with the external circuit. A through-hole 28 is formed at a short-circuited plane 27 of a cavity resonator 26 in a rectangular waveguide shape, in place of the inductive window 18 of the second embodiment. A coaxial cable connector 29 is fixed at the through-hole 28 in order to take out a microwave power by a loop 30 connected to a central conductive wire of the coaxial cable. Alternatively, the coaxial cable connector 29 may be inserted at the H-plane of the cavity resonator 26 thereby taking out a microwave power by a loop or a probe.

Figure 8:
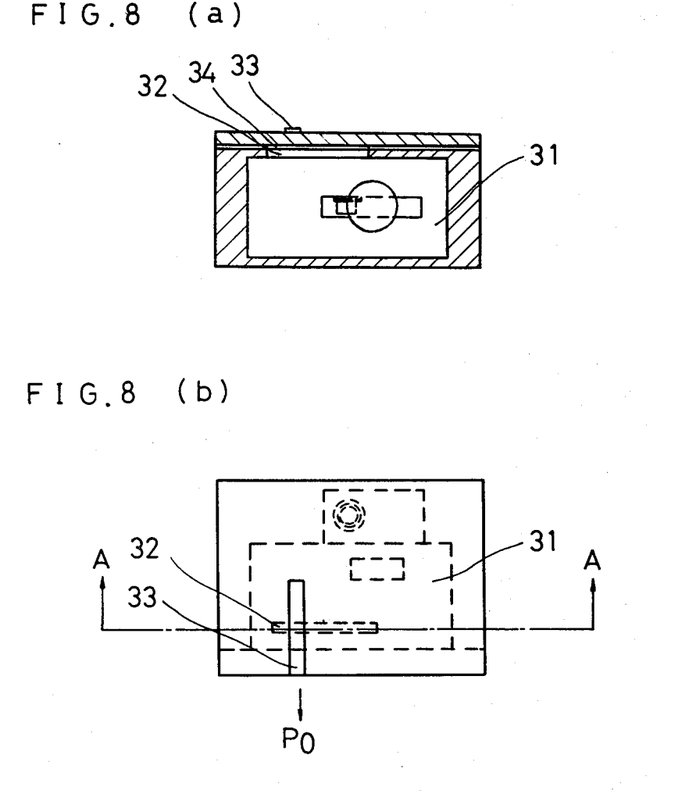
FIG. 8(b) is a top view of a microwave solid state oscillator in accordance with a fourth embodiment of the present invention.
FIG. 8(a) is a sectional elevation view taken on the plane shown by the A—A line of FIG. 8(b).

A microwave solid state oscillator of a fourth embodiment in accordance with the present invention is shown in FIGS. 8(a) and 8(b). FIG. 8(b) is a top view of the microwave solid state oscillator and FIG. 8(a) is a sectional elevation view taken on the plane shown by the A—A line of FIG. 8(b). A microwave stripline is employed as a transmission line in this embodiment. A frequency adjustment means, an electromagnetic wave absorber, a supporter means of a dielectric resonator and a voltage supply terminal of a solid state oscillation device are not shown in FIG. 8(a) and FIG. 8(b).

The configuration of the microwave solid state oscillator is the same as that of the second embodiment except a coupling portion for coupling with an external circuit. Therefore, an elucidation is given here only for the coupling portion with the external circuit. In this embodiment, a portion corresponding to the inductive window 18 of the second embodiment is short-circuited and a slot 32 is formed perpendicular to the axial direction of a rectangular waveguide used for a cavity resonator 31 and on the H-plane of the cavity resonator 31. A slot 34 of dimensions the same as that of the slot 32 is further formed at a grounded plate of the microwave strip transmission line so as to be in a direction perpendicular to a strip conductor 33. Two slots 32 and 34 are closely disposed to face to each other. The strip conductor 33 is closely fixed at an outside place of the H-plane. One end tip of the strip conductor 33 opposite to an output side is electromagnetically open at a place apart from the slot 34 by about λ'g/4 (λ'g: a guide wavelength of the microwave strip transmission line). The slot 32 in the cavity resonator 31 may be formed on the short-circuited plane opposite to the recess in the cavity resonator 31.

The features of the present invention are understood as described above. An electromagnetic energy generated by the solid state oscillation device is concentrated in the narrow space of the recess, and the magnetic wall is formed at the opening of the recess. It becomes easy to electromagnetically couple the dielectric resonator with the solid state oscillation device by disposing the disc plate face of the dielectric resonator of a large dielectric constant and a high Q factor so as to be adjacent and to face to the opening of the recess. This strong coupling contributes much to the high stabilization of the oscillation frequency. Moreover, the oscillation frequency of the microwave solid state oscillator is almost free from the resonance frequency of the cavity resonator itself, and therefore a cavity resonator of a simple structure can be used. For example, usual rectangular waveguides are used as the cavity resonator in the embodiments of the present invention thus giving rise to the simplification in the manufacture of the microwave solid state oscillator.

Figure 9:
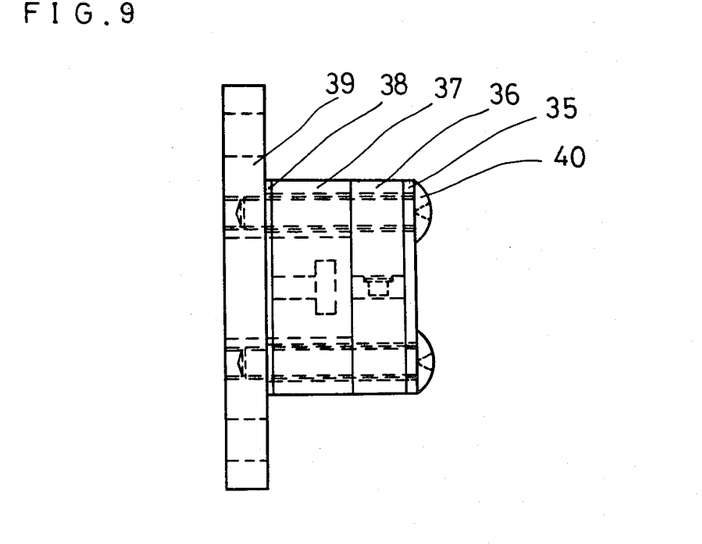
FIG. 9 is a side view of an actual example for the second embodiment of the present invention.

One example simplifying the construction of the microwave solid state oscillator is shown in FIG. 9. A microwave solid state oscillator in FIG. 9 comprises portions 35, 36, 37, 38 and 39 of flange-shaped forms or spacer-shaped forms. They are firstly manufactured separately. And after disposing a solid state oscillation device in the portion 36 and fixing a dielectric resonator at the portion 37 by means of a supporter means, they are assembled by bolts 40 to complete the microwave solid state oscillator. The microwave solid state oscillator in accordance with the present invention does not require forming a cut-off region, and therefore there is no problem to dispose the dielectric resonator precisely at a predetermined place in the cavity resonator.

Since the oscillation frequency of the microwave oscillator is almost free from the resonance frequency of the cavity resonator, it is possible to use a cavity resonator of a size smaller than that of the cavity resonator having a resonance frequency in the oscillation frequency of the microwave oscillator. The size reduction is further possible by disposing the dielectric resonator extremely close to the opening of the recess, since the wall proximity effect of the dielectric resonator is reduced due to the existence of the recess.

The decrease of the unloaded Q factor of the dielectric resonator is avoided by disposing the disc plate face of the dielectric resonator close to the opening of the recess. It is only necessary to pay attention to the wall proximity effect by the other disc plate face opposite to the opening of the recess, in order to improve the stability of the oscillation frequency of the microwave solid state oscillator. The present invention can provide a compact and light-weight microwave solid state oscillator superior in the electrical characteristics and easy to manufacture.

One application field of the microwave solid state oscillator in accordance with the present invention is a local oscillator for an SHF/UHF converter of an SHF television receiver. In such a case, an oscillation frequency of the microwave solid state oscillator lies in the frequency range of 11–12 GHz. There are naturally many other application fields in the microwave and millimeter wave frequency bands.

What is claimed is:

1. A dielectric-resonator-tuned microwave solid state oscillator comprising:
   a cavity resonator having a coupling window for coupling with an external circuit,
   a solid state oscillation device oscillating at a frequency, and
   a dielectric resonator of a large dielectric constant and a high Q factor,
   wherein said cavity resonator is a waveguide having a geometrical dimension which affords a non-cut-off characteristic for said frequency,
   said solid state oscillation device is installed in a recess which is formed on an inner side wall of said cavity resonator and having an opening sufficiently smaller than an internal size of said cavity resonator,
   and said dielectric resonator is disposed in said cavity resonator in a non-cut-off region thereof in a manner to face to and be adjacent to said opening of said recess.

2. A dielectric-resonator-tuned microwave solid state oscillator in accordance with claim 1 wherein an eleccoupled therewith by extending a looped central conductor of said coaxial cable into said rectangular resonator, and said recess is formed on one side wall of said rectangular resonator opposite to said looped central conductor.

22. A dielectric-resonator-tuned microwave solid state oscillator in accordance with claim 18 wherein said cavity resonator is a rectangular resonator, a stripline being attached thereto as said external circuit, and said recess is formed on one side wall of said rectangular resonator.

23. A dielectric-resonator-tuned microwave solid state oscillator in accordance with claim 18 wherein a depth of said recess is larger than $\lambda g/8$ and smaller than $\lambda g/4$, where $\lambda g$ is a guide wavelength.

* * * * *